(12) United States Patent
Sutaria et al.

(10) Patent No.: US 11,287,467 B2
(45) Date of Patent: Mar. 29, 2022

(54) APPARATUS AND METHOD FOR EARLY LIFETIME FAILURE DETECTION SYSTEM

(71) Applicant: Intel Corporation, Santa Clara, CA (US)

(72) Inventors: Ketul B. Sutaria, Beaverton, OR (US); Balkaran Gill, Cornelius, OR (US)

(73) Assignee: Intel Corporation, Santa Clara, CA (US)

( * ) Notice: Subject to any disclaimer, the term of this patent is extended or adjusted under 35 U.S.C. 154(b) by 176 days.

(21) Appl. No.: 16/844,895

(22) Filed: Apr. 9, 2020

(65) Prior Publication Data
US 2020/0408834 A1 Dec. 31, 2020

Related U.S. Application Data (60) Provisional application No. 62/866,518, filed on Jun. 25, 2019.

(51) Int. Cl.
*G01R 31/28* (2006.01)
(52) U.S. Cl.
CPC ..... *G01R 31/2856* (2013.01); *G01R 31/2874* (2013.01); *G01R 31/2879* (2013.01)

(58) Field of Classification Search
CPC ............ G01R 31/2874; G01R 31/2875; G01R 31/2877
See application file for complete search history.

(56) References Cited

U.S. PATENT DOCUMENTS

| | | | | |
|---|---|---|---|---|
| 5,552,733 A | * | 9/1996 | Lesmeister | ...... G01R 31/31709 327/100 |
| 8,354,857 B1 | * | 1/2013 | Rosen | ................ G01R 31/3016 324/762.01 |
| 2019/0279963 A1 | * | 9/2019 | Woo | .................... G01R 31/2853 |

* cited by examiner

*Primary Examiner* — Tung X Nguyen
(74) *Attorney, Agent, or Firm* — Schwabe, Williamson & Wyatt, P.C.

(57) ABSTRACT

An on-die early lifetime failure detection system with a reliability mechanism isolation circuit provides an early lifetime failure detection. The system measures and monitors reliability at time-0 (t0) and end-of-life. The measurements enable detection of latent reliability or marginality issues during the lifetime of the product. The system includes: a stress controller to adjust voltage for a power supply and voltage for a ground supply in accordance with one or more sensors; and an aging detector circuitry coupled to the stress controller, wherein the aging detector circuitry comprises a ring oscillator having delay stages, wherein each delay stage comprises an aging monitor circuitry, wherein the stress controller to adjust voltage for a power supply and voltage for a ground supply of the delay stage.

20 Claims, 7 Drawing Sheets

Chip (Condition-1): Hot temperature and low workload

APPARATUS AND METHOD FOR EARLY LIFETIME FAILURE DETECTION SYSTEM

CLAIM FOR PRIORITY

This application claims priority to U.S. Provisional Patent Application No. 62/866,518, filed on Jun. 25, 2019, titled "APPARATUS AND METHOD FOR EARLY LIFETIME FAILURE DETECTION SYSTEM," and which is incorporated by reference in entirety.

BACKGROUND

As technology reaches scaling limits, end-of-life (EOL) failures due to aging exponentially increase. Performance improvements by pushing operating voltage higher further compounds EOL failures. Leveraging reliability models derived from standalone discrete transistor to predict circuit and/or product failures is a very complex issue and not well understood. Any irregularities in device-level reliability models may have profound risks on circuits and/or products EOL failure. Reasonable guard-band are taxed to mitigate product failure risk before guaranteed lifetime without compromising performance.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Modulation in ambient conditions (e.g., in-field temperature, use conditions etc.) induces variability on circuits/products aging. For example, when an integrated circuit (IC) chip is used in a high-end car purchased in Arizona where temperatures are extremely hot in summer, certain aging mechanisms dominate few IP (intellectual property) blocks (such as processor cores and memory), which age faster compared to other IP blocks (such as voltage regulators or I/O circuits) on an IC. When the same IC chip product is used in a transport vehicle in Alaska, which has much higher workload and lower temperature, change in conditions cause different IP blocks to fail faster. Although they are the same product, aging affects them differently. Such variability is not acceptable for certain applications such as self-driving vehicles, high-end servers, space application, drones, etc. For example, automotive products (especially self-driving vehicles) have much more stringent reliability specifications, which needs the device (transistor) to last for 10-15 years with relatively the same performance expectation. Respective governments set these requirements. For example, to be compliant with the Grade 0 AECQ100 standard (which is a failure mechanism based stress test qualification for integrated circuits) for automotive products together with an accurate failure rate control down to 1 ppm (parts per million), process, temperature and aging schemes are jointly used. In parallel, the new version of ISO26262 norm requires a constant, runtime safety monitoring.

Some embodiments describe an on-die early lifetime failure detection system with a reliability mechanism isolation circuit. This early lifetime failure detection system measures and monitors reliability at time-0 (t0) and EOL. The measurements enable detection of latent reliability or marginality issues during the lifetime of the product. Past approaches measure overall circuit degradation and are not sensitive to a particular aging mechanism (Bias Temperature Instability (BTI)-PMOS/NMOS (BTI-P/N) or Hot Carrier Injection (HCI)-PMOS/NMOS (HCI-P/N)). Each of these mechanisms strongly depend on operating voltages and temperatures. As a result, integrated circuits in a self-driving car in Alaska will age very differently from a car in Arizona. Taxing worst-case guard-band on all dies may cause reduced yield and sub-optimal performance which directly impacts revenue. Ability to configure a single circuit structure for different aging mechanisms may help measure realistic and accurate lifetime of a product. As such, the product's lifetime can be optimized safely.

Existing on-die reliability monitoring includes sensors for detecting overall circuit degradation due to combination of BTI and HCI from PMOS and NMOS. Existing architectures cannot configure individual aging mechanisms separately. Thus, such architectures may not detect variability in a product's lifetime based on ambient conditions.

Some embodiments allow modulation of four different aging components (BTI-P/N and HCI-P/N) individually as opposed to convoluted characterization method. This is achieved by using a multiplexer circuit, which allows overall architecture to control individual gate voltage of a PMOS and NMOS during stress phase in addition to supply voltage, which is drain voltage. By setting appropriate voltages, the circuits of various embodiments can be configured for a particular, or combination of more aging mechanisms based on ambient conditions (e.g., workload, temperature, etc.) to accurately detect EOL failure and enhance product safety.

There are many technical effects of various embodiments. For example, the circuit architecture of some embodiments can align itself to an individual on-field ambient conditions (e.g., workload, temperature etc.). This allows the detection system to adapt for variability due to manufacturing process as well and reduce wear-out DPM (defects per million). This also allows monitoring health of a product on-field and enables early failure detection system. The on-die design for reliability features (DFR) are desired for automotive and IOT (internet-of-things) markets to ensure fail-safe mission mode operation, potentially life-saving in multiple cases.

Die-level aging design for reliability feature (DFR) of some embodiments can be integrated with BISR (Built In Self Repair) to measure/monitor the BTI/HCI of PMOS and NMOS aging across the life-time of a product. This allows for early failure detection as well as providing the opportunity for corrective actions such as setting appropriate guard-bands, use-conditions, and safely optimizing the V/F (voltage and/or frequency) performance for lifetime of product. Without reliability monitors, worst-case timing and voltage guard band are added to ensure product operation for lifetime.

Guard-band for aging may not be completely eliminated during design phase. The innovative aging monitors of some embodiment can comprehend few, if not all, marginal cases within a design. Thus, to protect design, guard-banding is used. However, guard-band is added based on the worst-case marginal scenarios/data-paths and variations. These guard-bands can result in penalizing a design, which is not always running at the worst-case use conditions. Furthermore, any excursion in manufacturing process or unforeseen events can skew design marginality. A symbiotic balance can be established between guard-banding and aging monitors using the apparatus of various embodiments.

Aging guard-band is typically set for 3-sigma degradation on both PMOS and NMOS devices for product reliability assessment in addition to worst case time0 corner. The aging guard-band can be reduced by performing a reliability check at worst-case time0 corner and median degradation on PMOS and NMOS devices. Aging monitor of various embodiments comprehends aging variation along with use condition.

To be competitive in today's market, turbo operating conditions are used. Accounting for turbo operating conditions into guard-band can significantly limit product potential. This early lifetime failure detection system of some embodiments allows comprehension of aging at turbo without building in unnecessary pessimism into guard-bands.

The early lifetime failure detection system of some embodiments allows a designer to place corrective mechanisms. Correction mechanisms include: change in operating voltages, frequency or design redundancies, etc. This allows further guard-band reduction, but may need careful deliberation so that correcting mechanisms do not accelerate aging.

The apparatus of various embodiments also results in high-volume manufacturing (HVM) die steering. Generally, 10-20 sites per 800 dice/wafer are measured to estimate wafer-level breakdown distributions for aging (e.g., approx. 2% sampling). This may severely limit the understanding of die-to-die variations. On-die DFR based structures of various embodiments provide improved statistics compared to the method of 10 reticle sites/wafer (e.g., estimated sampling improvement of approximately 10×-80×). As such, the circuits of various embodiments improve aging sensitivity as it allows characterization of aging mechanisms individually.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and may be subsequently being reduced in layout area. In some cases, scaling also refers to upsizing a design from one process technology to another process technology and may be subsequently increasing layout area. The term "scaling" generally also refers to downsizing or upsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions.

It is pointed out that those elements of the figures having the same reference numbers (or names) as the elements of any other figure can operate or function in any manner similar to that described but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

Figure 1:
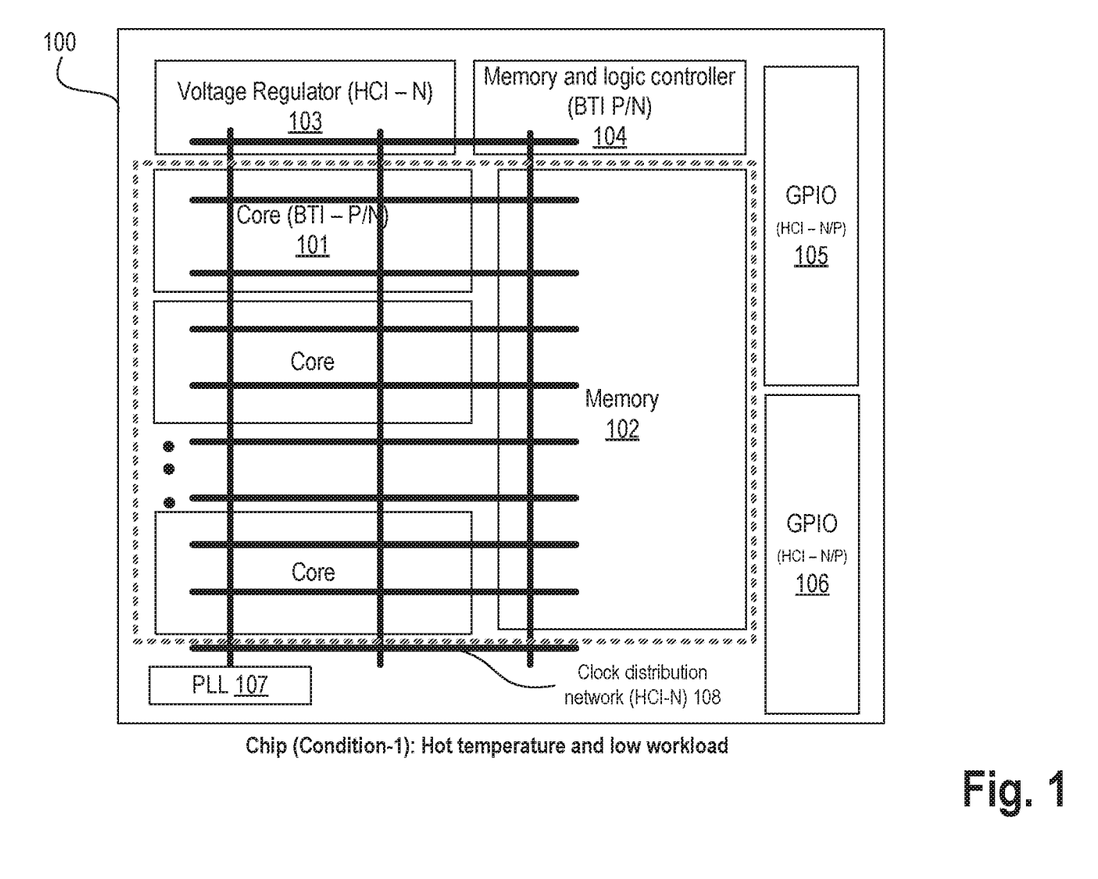
FIG. 1 illustrates Intellectual Property (IP) blocks, in an integrated circuit (IC), that are expected to age due to hot temperature and low workload.

FIG. 1 illustrates an integrated circuit (IC) 100 with hot temperature and low workload. IC 100 consists of various IP blocks such as a one or more cores 101, memory 102, voltage regulator (VR) 103, memory and logic controller 104, GPIOs 105 and 106, phase locked loop (PLL) 107, clock distribution network 108. This example illustrates the case when IC chip 100 is used in a high-end car purchased in Arizona where temperature are extremely hot in summer, aging mechanism dominates and certain IP blocks as indicated by the dotted box (such as cores 101 and memory 102) age faster.

Figure 2:
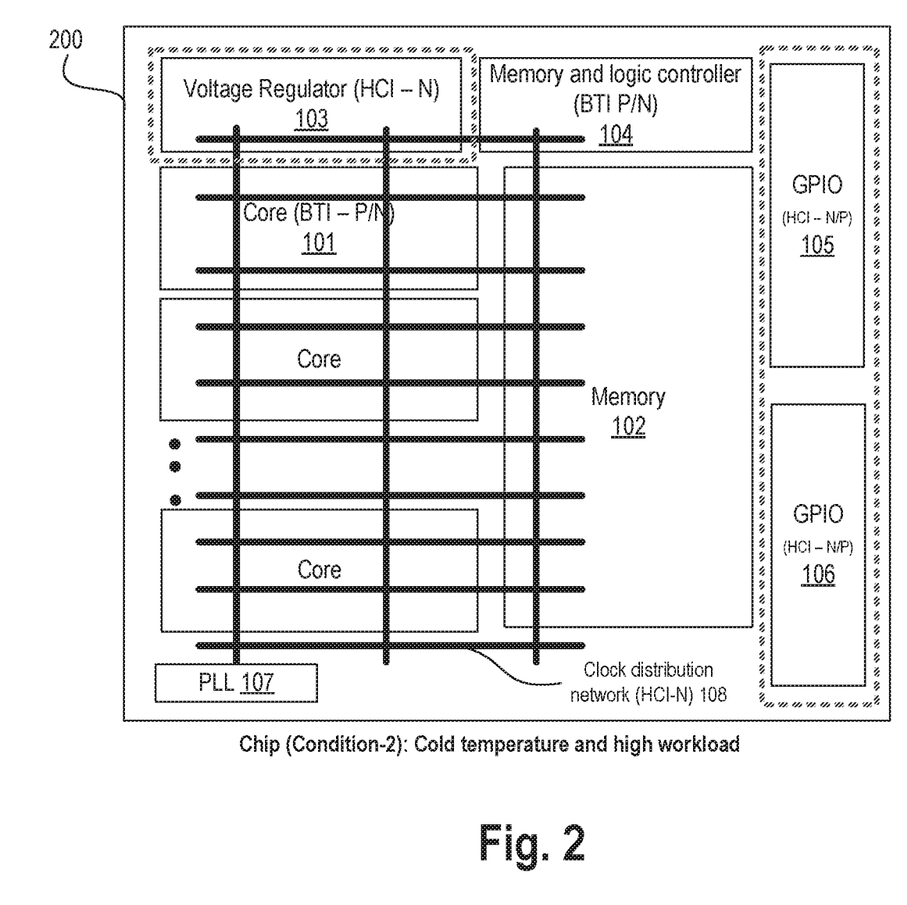
FIG. 2 illustrates IP blocks in an IC expected to age due to cold temperature and high workload.

FIG. 2 illustrates IC 200 with cold temperature and high workload. In this example, when the same IC chip product of FIG. 1 is used in a transport vehicle in Alaska, which has much higher workload and lower temperature, change in conditions causes different IP blocks (e.g., VR 103 and GPIOs 105/106) to fail faster, as indicated by dotted blocks. Although they are same product as in FIG. 1, aging affects the IP blocks differently. Such variability are not acceptable for certain applications such as self-driving vehicles, high-end servers, space application, drones, etc. For example, automotive products (especially self-driving vehicles) have much stringent reliability specifications which need devices (transistor) to last for 10-15 years.

Figure 3:
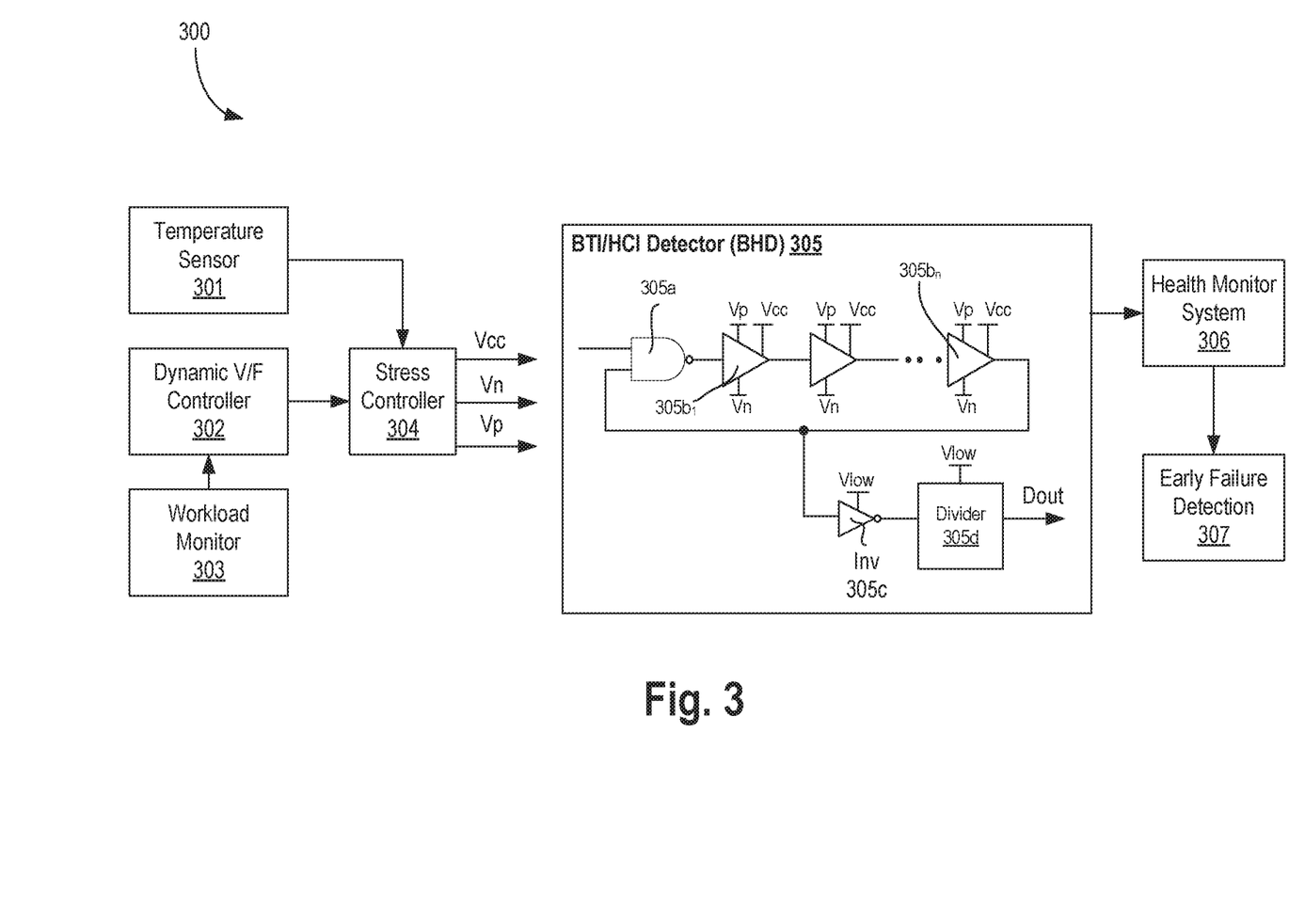
FIG. 3 illustrates an apparatus with early failure detection system, in accordance with some embodiments.

FIG. 3 illustrates apparatus 300 with early failure detection system, in accordance with some embodiments. Apparatus 300 comprises temperature sensor 301, dynamic voltage and/or frequency (V/F) controller 302, workload monitor 303, stress controller 304, BTI/HCI detector (BHD) 305, health monitor system 306, and early failure detector 307. In some embodiments, stress controller 304 receives information from various sensors including temperature sensor 301, voltage and/or frequency of the IP block (e.g., core) etc. The embodiments are not limited to just these sensors. In some embodiments, other on-die reliability sensors are added to the product to measure and monitor time0 and end-of-life (EOL) reliability. These measurements enable detection of latent reliability mechanisms or marginality issue during the lifetime of the product.

In some embodiments, Dynamic V/F controller 302 adjusts the supply voltage and/or clock frequency to the IP block based on a predicted and/or current workload on the IP block. For example, if the expected workload is to increase, then controller 302 increases the supply voltage V and/or clock frequency F of the IP block to manage the increase in work load. In various embodiments, stress controller 304 analyzes the temperature of the IP block and/or the IC chip along with the other sensor parameters such as V/F and generates supply voltages Vcc, Vn, and Vp for BHD 305.

In some embodiments, BHD 305 comprises a ring-oscillator (RO) including NAND gate 305a and drivers $305b_{1-n}$ (where n is a number) coupled in a ring formation. The output of the RO is received by inverter 305c. The NAND gate 305a can be configured as an inverter during normal mode of the RO. In some embodiments, the RO can be disabled by NAND gate 305a. In some embodiments, NAND gate 305a is replaced with a NOR gate, or any other suitable gate that can be configured as an inverter and can have a controlled output.

The RO DUT contains BHD cells $305b_{1-n}$ that enable characterization of PMOS-BTI/HCI or NMOS-BTI/HCI. The output of the inverter is divided by a signal divider (e.g., clock divider) 305d. The output Dout of BHD 305 is then analyzed by a health monitor system 306. The health monitor system 306 can be implemented in hardware, software, or a combination of them. Health monitor system 306 monitors the frequency of Dout to determine the reliability of the IP block. In one example, if the oscillation frequency of Dout reduces over time, then health monitor system 306 informs early failure detector 307 to issue a warning or notification to the user that an IP block may fail. In some embodiments, health monitor system 306 also monitors the slope and/or signal swing of Dout to determine possible failure of the IP block. For example, if the slope degrades over time (e.g., becomes slower) then the IP block is perhaps becoming slow and tending to fail. In another example, if the swing of Dout is reducing, then noise margin for the circuits of the IP block reduces. As such, health monitor system 306 may indicate a possible failure.

In some embodiments, inverter 305c comprises thick gate transistors. In some embodiments, divider 305d comprises thin gate transistors. In some embodiments, inverter 305c comprises thin gate transistors instead of thick gate transistors. In various embodiments, the devices that form the ring oscillator are stressed while other devices (e.g., inverter 305c and/or divider 305d) that are not part of the ring oscillator operate on low supply voltage Vlow. For example, NAND gate 305a and drivers $305b_{1-n}$ are stressed at different supply voltages (e.g., Vn) that can be higher than Vlow, while peripheral circuits such as inverter 305c and divider 305d that are used to measure the oscillating frequency of the ring oscillator, operate on Vlow power supply, which is lower than Vcc and/or Vn. The voltage level of Vlow limits or reduces aging effects on devices of such peripheral circuits.

In some embodiments, stress controller 305 comprises a state machine to configure stress voltages ($V_{cc}$, $V_n$, $V_p$) based on the ambient conditions such as temperature from sensor 301, and operating voltage and frequency from controller 302. Stress controller 305 sets voltages $V_{cc}$, $V_n$, $V_p$ to stress BHD DUT 305 for a particular aging mechanism (BTI-P/N and HCI-P/N) which is dominant for given ambient conditions. Conditions for stress controller to 305 to configure ($V_{cc}$, $V_n$, $V_p$) are derived from different IP on the product as discussed with reference to FIGS. 1-2. For example, for core, stress controller to 305 receives a clock frequency from the data-path. In another example, for low dropout voltage regulator (VR), stress controller to 305 receives output resistance.

Table 1 shows input conditions to BHD DUT 305 to configure it for a particular reliability mechanism.

TABLE 1

| Vp | Vn | Vcc | Temp | Reliability Mechanism |
|---|---|---|---|---|
| Low (−ve) | Low | Low | High | NBTI |
| Low (−ve) | Low | High (>Vcc) | High | PMOS HCI + NBTI |
| Low | High (>Vcc) | Low | High | PBTI |
| Low | High (>Vcc) | High (>Vcc) | Low | NMOS HCI + PBTI |

In regular or simple inverter based RO, the effect of all reliability mechanisms cannot be measured distinctly. Here, once configured, BHD 305 continually monitors IC's health on the fly. The degradation of DUT 305 is directly correlated to aging of critical circuit blocks present in a product. Once BHD DUT's aging reaches a particular threshold, a signal is generated as an early lifetime failure warning by detector 307.

Figure 4:
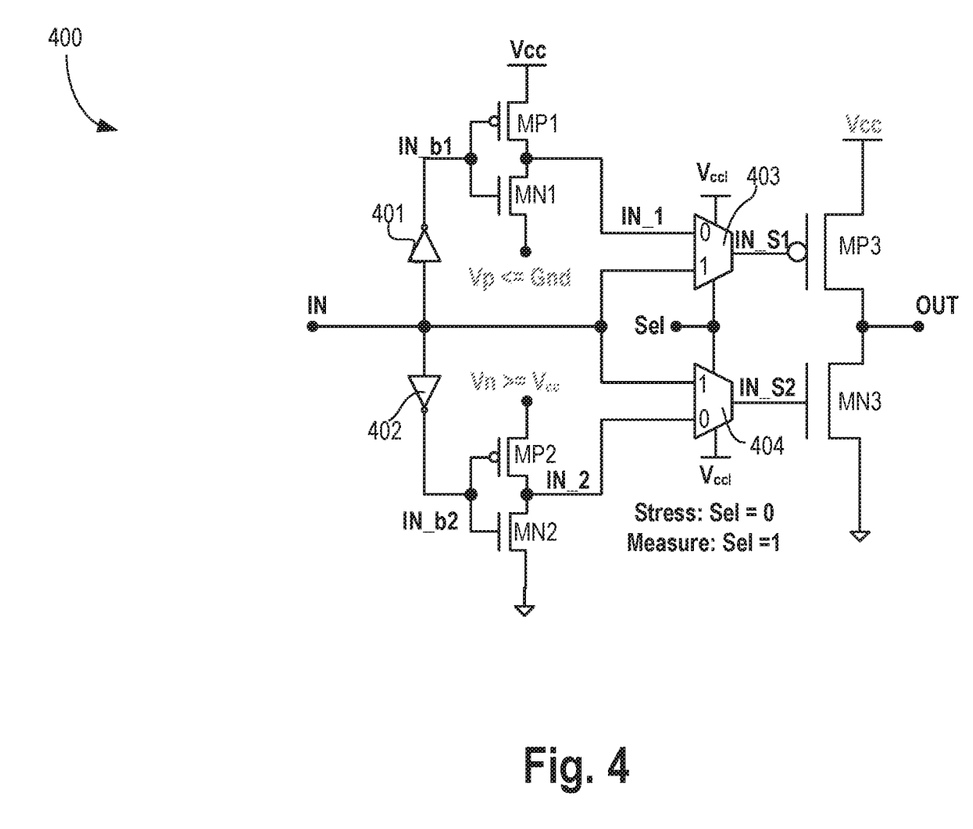
FIG. 4 illustrates a single-stage circuit implementation of a ring oscillator based aging reliability monitor, in accordance with some embodiments.

FIG. 4 illustrates aging reliability monitor circuit 400, in accordance with some embodiments. The circuit implementation of FIG. 4 is of a single stage (e.g., driver 305b1) of BTI/HCI detector DUT 305. The single-stage circuit 400 comprises inverter 401, inverter 402, p-type devices MP1, MP2, and MP3, n-type devices MN1, MN2, and MN3, and multiplexers 403 and 404 coupled as shown. The input IN is inverted by inverters 401 and 402 to generate IN_b1 and IN_b2 signals, respectively. Here, Vp is less than or equal to ground while Vn is greater than or equal to nominal voltage supply Vcc. Vn and Vp are generated by stress controller 304. Depending on the mode of operation, stress or measure, multiplexers 403 and 404 select IN or IN_1 and IN_2 as the driving signals for p-type device MP3 and n-type device MN3, respectively, to generate OUT. In some embodiments, Sel is controlled by stress controller 304 and/or health monitor 306.

Figure 5:
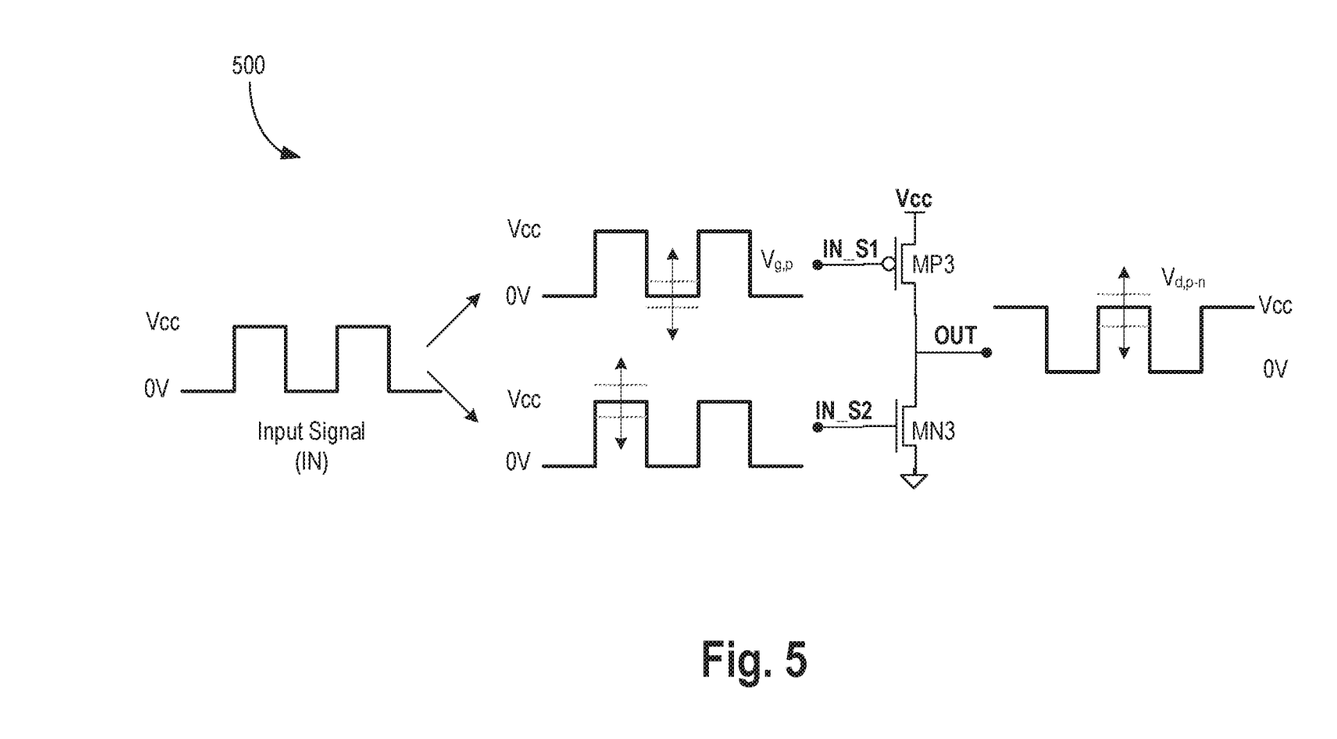
FIG. 5 illustrates a device-under-test (DUT), in accordance with some embodiments.

FIG. 5 illustrates a device-under-test (DUT) 500, in accordance with some embodiments. FIG. 5 shows first order principle of BHD DUT operation. Here, the idea is to modulate gate voltages of p-type device MP3 and n-type device MN3 individually along with $V_{cc}$, which facilitate separate change in drain voltages. Separate control (via IN_S1 and IN_S2) allows stress controller 304 to configure BHD DUT 305 for a particular aging physics depending on temperature, as described in Table 1.

Figure 6A:
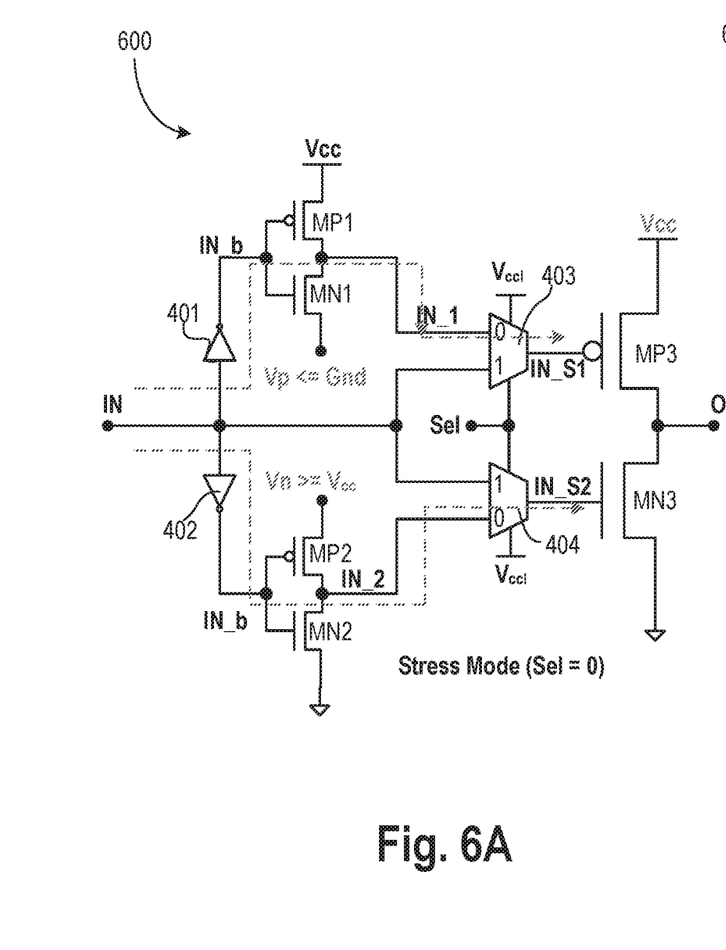
FIG. 6A illustrates a stress mode or configuration of a DUT, in accordance with some embodiments.
Figure 6B:
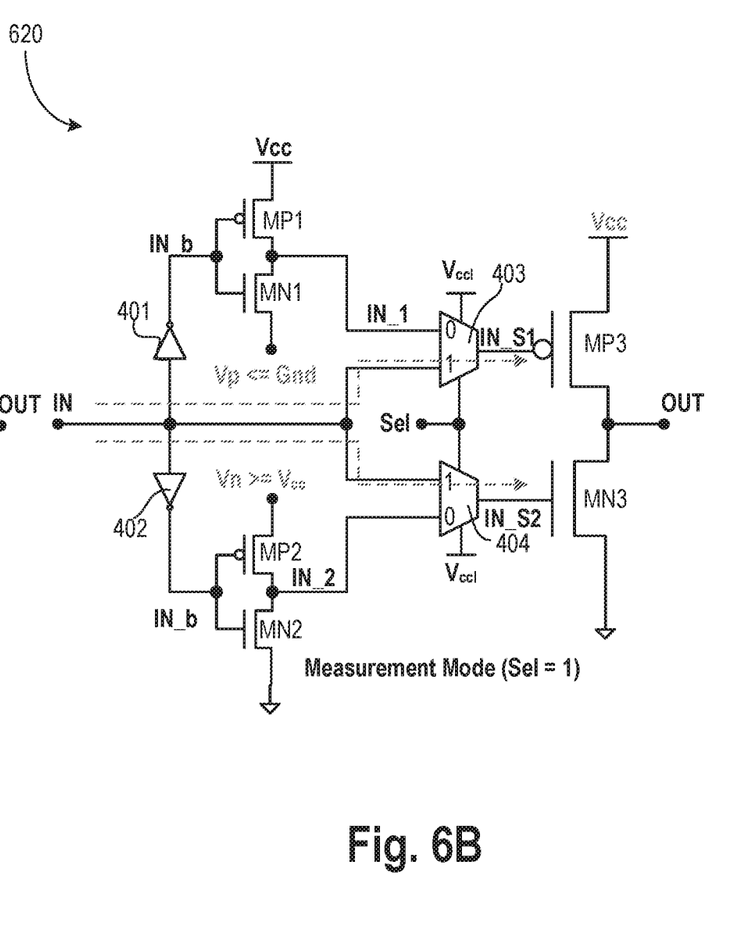
FIG. 6B illustrates a measurement mode or configuration of a DUT, in accordance with some embodiments.

FIG. 6A illustrates a stress model of a DUT 600, in accordance with some embodiments. FIG. 6B illustrates a measurement model of a DUT 620, in accordance with some embodiments. FIGS. 6A-B show how a delay stage (e.g., 400) of BHD DUT 305 is set up in stress mode or measurement mode, respectively. In stress mode (FIG. 6A), the input signal is passed through secondary inverters (e.g., MP1, MN1 and MP2, MN2). The power rail for these two inverters are modified from (Vcc and Gnd) to (Vcc and Vp) for first inverter (e.g., MP1 and MN1) and (Vn and Gnd) for the second inverter (e.g., MP2 and MN2). These inverters help modify input signal levels as described in FIG. 3. In measurement mode (FIG. 6B), these secondary inverters are by-passed as shown by multiplexers 403 and 404. Thus, aging of these secondary inverters do not impact aging characterization.

This system can also be used in a closed loop configuration. The signal Dout from BHD DUT 305 degradation can be feedback to Dynamic V/F (Voltage/Frequency) controller 302. Based on DUT degradation, operating voltages and frequencies can be updated to nullify product aging, in accordance with some embodiments. However, this is a positive feedback loop. In order to nullify aging, voltage and frequency may need to increase. This usually increases aging rate and limits lifetime.

Figure 7:
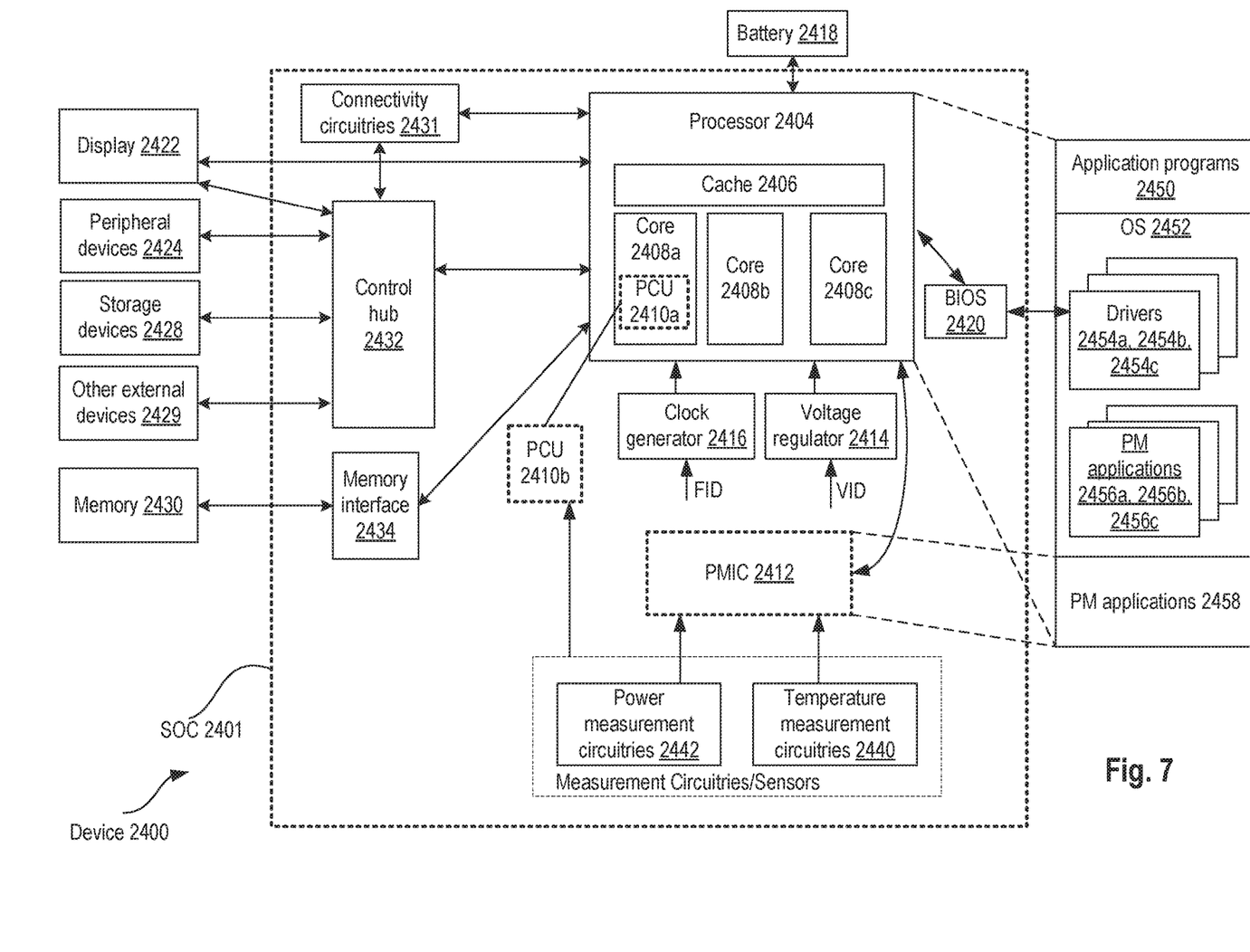
FIG. 7 illustrates a smart device or a computer system or a SoC (System-on-Chip) having apparatus with early failure detection system, in accordance with various embodiments.

FIG. 7 illustrates a smart device or a computer system or a SoC (System-on-Chip) having apparatus with early failure detection system, in accordance with various embodiments. It is pointed out that those elements of FIG. 7 having the same reference numbers (or names) as the elements of any other figure can operate or function in any manner similar to that described, but are not limited to such. Any of the blocks described here can have the apparatus with early failure detection system.

In some embodiments, device 2400 represents an appropriate computing device, such as a computing tablet, a mobile phone or smart-phone, a laptop, a desktop, an Internet-of-Things (IOT) device, a server, a wearable device, a set-top box, a wireless-enabled e-reader, or the like. It will be understood that certain components are shown generally, and not all components of such a device are shown in device 2400.

In an example, the device 2400 comprises a SoC (System-on-Chip) 2401. An example boundary of the SOC 2401 is illustrated using dotted lines in FIG. 7, with some example components being illustrated to be included within SOC 2401—however, SOC 2401 may include any appropriate components of device 2400.

In some embodiments, device 2400 includes processor 2404. Processor 2404 can include one or more physical devices, such as microprocessors, application processors, microcontrollers, programmable logic devices, processing cores, or other processing means. The processing operations performed by processor 2404 include the execution of an operating platform or operating system on which applications and/or device functions are executed. The processing operations include operations related to I/O (input/output) with a human user or with other devices, operations related to power management, operations related to connecting computing device 2400 to another device, and/or the like. The processing operations may also include operations related to audio I/O and/or display I/O.

In some embodiments, processor 2404 includes multiple processing cores (also referred to as cores) 2408a, 2408b, 2408c. Although merely three cores 2408a, 2408b, 2408c are illustrated in FIG. 7, processor 2404 may include any other appropriate number of processing cores, e.g., tens, or even hundreds of processing cores. Processor cores 2408a, 2408b, 2408c may be implemented on a single integrated circuit (IC) chip. Moreover, the chip may include one or more shared and/or private caches, buses or interconnections, graphics and/or memory controllers, or other components.

In some embodiments, processor 2404 includes cache 2406. In an example, sections of cache 2406 may be dedicated to individual cores 2408 (e.g., a first section of cache 2406 dedicated to core 2408a, a second section of cache 2406 dedicated to core 2408b, and so on). In an example, one or more sections of cache 2406 may be shared among two or more of cores 2408. Cache 2406 may be split in different levels, e.g., level 1 (L1) cache, level 2 (L2) cache, level 3 (L3) cache, etc.

In some embodiments, processor core 2404 may include a fetch unit to fetch instructions (including instructions with conditional branches) for execution by the core 2404. The instructions may be fetched from any storage devices such as the memory 2430. Processor core 2404 may also include a decode unit to decode the fetched instruction. For example, the decode unit may decode the fetched instruction into a plurality of micro-operations. Processor core 2404 may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit.

Further, execution unit may execute instructions out-of-order. Hence, processor core 2404 may be an out-of-order processor core in one embodiment. Processor core 2404 may also include a retirement unit. The retirement unit may retire executed instructions after they are committed. In an embodiment, retirement of the executed instructions may result in processor state being committed from the execution of the instructions, physical registers used by the instructions being de-allocated, etc. Processor core 2404 may also include a bus unit to enable communication between components of processor core 2404 and other components via one or more buses. Processor core 2404 may also include one or more registers to store data accessed by various components of the core 2404 (such as values related to assigned app priorities and/or sub-system states (modes) association.

In some embodiments, device 2400 comprises connectivity circuitries 2431. For example, connectivity circuitries 2431 includes hardware devices (e.g., wireless and/or wired connectors and communication hardware) and/or software components (e.g., drivers, protocol stacks), e.g., to enable device 2400 to communicate with external devices. Device 2400 may be separate from the external devices, such as other computing devices, wireless access points or base stations, etc.

In an example, connectivity circuitries 2431 may include multiple different types of connectivity. To generalize, the connectivity circuitries 2431 may include cellular connectivity circuitries, wireless connectivity circuitries, etc. Cellular connectivity circuitries of connectivity circuitries 2431 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 2431 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 2431 may include a network interface, such as a wired or wireless interface, e.g., so that a system embodiment may be incorporated into a wireless device, for example, a cell phone or personal digital assistant.

In some embodiments, device 2400 comprises control hub 2432, which represents hardware devices and/or software components related to interaction with one or more I/O devices. For example, processor 2404 may communicate with one or more of display 2422, one or more peripheral devices 2424, storage devices 2428, one or more other external devices 2429, etc., via control hub 2432. Control hub 2432 may be a chipset, a Platform Control Hub (PCH), and/or the like.

For example, control hub 2432 illustrates one or more connection points for additional devices that connect to device 2400, e.g., through which a user might interact with the system. For example, devices (e.g., devices 2429) that can be attached to device 2400 include microphone devices, speaker or stereo systems, audio devices, video systems or other display devices, keyboard or keypad devices, or other I/O devices for use with specific applications such as card readers or other devices.

As mentioned above, control hub 2432 can interact with audio devices, display 2422, etc. For example, input through a microphone or other audio device can provide input or commands for one or more applications or functions of device 2400. Additionally, audio output can be provided instead of, or in addition to display output. In another example, if display 2422 includes a touch screen, display 2422 also acts as an input device, which can be at least partially managed by control hub 2432. There can also be additional buttons or switches on computing device 2400 to provide I/O functions managed by control hub 2432. In one embodiment, control hub 2432 manages devices such as accelerometers, cameras, light sensors or other environmental sensors, or other hardware that can be included in device 2400. The input can be part of direct user interaction, as well as providing environmental input to the system to influence its operations (such as filtering for noise, adjusting displays for brightness detection, applying a flash for a camera, or other features).

In some embodiments, control hub 2432 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 2422 represents hardware (e.g., display devices) and software (e.g., drivers) components that provide a visual and/or tactile display for a user to interact with device 2400. Display 2422 may include a display interface, a display screen, and/or hardware device used to provide a display to a user. In some embodiments, display 2422 includes a touch screen (or touch pad) device that provides both output and input to a user. In an example, display 2422 may communicate directly with the processor 2404. Display 2422 can be one or more of an internal display device, as in a mobile electronic device or a laptop device or an external display device attached via a display interface (e.g., DisplayPort, etc.). In one embodiment display 2422 can be a head mounted display (HMD) such as a stereoscopic display device for use in virtual reality (VR) applications or augmented reality (AR) applications.

In some embodiments, and although not illustrated in the figure, in addition to (or instead of) processor 2404, device 2400 may include Graphics Processing Unit (GPU) comprising one or more graphics processing cores, which may control one or more aspects of displaying contents on display 2422.

Control hub 2432 (or platform controller hub) may include hardware interfaces and connectors, as well as software components (e.g., drivers, protocol stacks) to make peripheral connections, e.g., to peripheral devices 2424.

It will be understood that device 2400 could both be a peripheral device to other computing devices, as well as have peripheral devices connected to it. Device 2400 may have a "docking" connector to connect to other computing devices for purposes such as managing (e.g., downloading and/or uploading, changing, synchronizing) content on device 2400. Additionally, a docking connector can allow device 2400 to connect to certain peripherals that allow computing device 2400 to control content output, for example, to audiovisual or other systems.

In addition to a proprietary docking connector or other proprietary connection hardware, device 2400 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 2431 may be coupled to control hub 2432, e.g., in addition to, or instead of, being coupled directly to the processor 2404. In some embodiments, display 2422 may be coupled to control hub 2432, e.g., in addition to, or instead of, being coupled directly to processor 2404.

In some embodiments, device 2400 comprises memory 2430 coupled to processor 2404 via memory interface 2434. Memory 2430 includes memory devices for storing information in device 2400.

In some embodiments, memory 2430 includes apparatus to maintain stable clocking as described with reference to various embodiments. Memory can include nonvolatile (state does not change if power to the memory device is interrupted) and/or volatile (state is indeterminate if power to the memory device is interrupted) memory devices. Memory device 2430 can be a dynamic random access memory (DRAM) device, a static random access memory (SRAM) device, flash memory device, phase-change memory device, or some other memory device having suitable performance to serve as process memory. In one embodiment, memory 2430 can operate as system memory for device 2400, to store data and instructions for use when the one or more processors 2404 executes an application or process. Memory 2430 can store application data, user data, music, photos, documents, or other data, as well as system data (whether long-term or temporary) related to the execution of the applications and functions of device 2400.

Elements of various embodiments and examples are also provided as a machine-readable medium (e.g., memory 2430) for storing the computer-executable instructions (e.g., instructions to implement any other processes discussed herein). The machine-readable medium (e.g., memory 2430) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 2400 comprises temperature measurement circuitries 2440, e.g., for measuring temperature of various components of device 2400. In an example, temperature measurement circuitries 2440 may be embedded, or coupled or attached to various components, whose temperature are to be measured and monitored. For example, temperature measurement circuitries 2440 may measure temperature of (or within) one or more of cores 2408a, 2408b, 2408c, voltage regulator 2414, memory 2430, a mother-board of SOC 2401, and/or any appropriate component of device 2400.

In some embodiments, device 2400 comprises power measurement circuitries 2442, e.g., for measuring power consumed by one or more components of the device 2400. In an example, in addition to, or instead of, measuring power, the power measurement circuitries 2442 may measure voltage and/or current. In an example, the power measurement circuitries 2442 may be embedded, or coupled or attached to various components, whose power, voltage, and/or current consumption are to be measured and monitored. For example, power measurement circuitries 2442 may measure power, current and/or voltage supplied by one or more voltage regulators 2414, power supplied to SOC 2401, power supplied to device 2400, power consumed by processor 2404 (or any other component) of device 2400, etc.

In some embodiments, device 2400 comprises one or more voltage regulator circuitries, generally referred to as voltage regulator (VR) 2414. VR 2414 generates signals at appropriate voltage levels, which may be supplied to operate any appropriate components of the device 2400. Merely as an example, VR 2414 is illustrated to be supplying signals to processor 2404 of device 2400. In some embodiments, VR 2414 receives one or more Voltage Identification (VID) signals, and generates the voltage signal at an appropriate level, based on the VID signals. Various type of VRs may be utilized for the VR 2414. For example, VR 2414 may include a "buck" VR, "boost" VR, a combination of buck and boost VRs, low dropout (LDO) regulators, switching DC-DC regulators, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR, which is controlled by PCU 2410a/b and/or PMIC 2412. In some embodiments, each core has a network of distributed LDOs to provide efficient control for power management. The LDOs can be digital, analog, or a combination of digital or analog LDOs.

In some embodiments, device 2400 comprises one or more clock generator circuitries, generally referred to as clock generator 2416. Clock generator 2416 generates clock signals at appropriate frequency levels, which may be supplied to any appropriate components of device 2400. Merely as an example, clock generator 2416 is illustrated to be supplying clock signals to processor 2404 of device 2400. In some embodiments, clock generator 2416 receives one or more Frequency Identification (FID) signals, and generates the clock signals at an appropriate frequency, based on the FID signals.

In some embodiments, device 2400 comprises battery 2418 supplying power to various components of device 2400. Merely as an example, battery 2418 is illustrated to be supplying power to processor 2404. Although not illustrated in the figures, device 2400 may comprise a charging circuitry, e.g., to recharge the battery, based on Alternating Current (AC) power supply received from an AC adapter.

In some embodiments, device 2400 comprises Power Control Unit (PCU) 2410 (also referred to as Power Management Unit (PMU), Power Controller, etc.). In an example, some sections of PCU 2410 may be implemented by one or more processing cores 2408, and these sections of PCU 2410 are symbolically illustrated using a dotted box and labelled PCU 2410*a*. In an example, some other sections of PCU 2410 may be implemented outside the processing cores 2408, and these sections of PCU 2410 are symbolically illustrated using a dotted box and labelled as PCU 2410*b*. PCU 2410 may implement various power management operations for device 2400. PCU 2410 may include hardware interfaces, hardware circuitries, connectors, registers, etc., as well as software components (e.g., drivers, protocol stacks), to implement various power management operations for device 2400.

In some embodiments, device 2400 comprises Power Management Integrated Circuit (PMIC) 2412, e.g., to implement various power management operations for device 2400. In some embodiments, PMIC 2412 is a Reconfigurable Power Management ICs (RPMICs) and/or an IMVP (Intel® Mobile Voltage Positioning). In an example, the PMIC is within an IC chip separate from processor 2404. The may implement various power management operations for device 2400. PMIC 2412 may include hardware interfaces, hardware circuitries, connectors, registers, etc., as well as software components (e.g., drivers, protocol stacks), to implement various power management operations for device 2400.

In an example, device 2400 comprises one or both PCU 2410 or PMIC 2412. In an example, any one of PCU 2410 or PMIC 2412 may be absent in device 2400, and hence, these components are illustrated using dotted lines.

Various power management operations of device 2400 may be performed by PCU 2410, by PMIC 2412, or by a combination of PCU 2410 and PMIC 2412. For example, PCU 2410 and/or PMIC 2412 may select a power state (e.g., P-state) for various components of device 2400. For example, PCU 2410 and/or PMIC 2412 may select a power state (e.g., in accordance with the ACPI (Advanced Configuration and Power Interface) specification) for various components of device 2400. Merely as an example, PCU 2410 and/or PMIC 2412 may cause various components of the device 2400 to transition to a sleep state, to an active state, to an appropriate C state (e.g., C0 state, or another appropriate C state, in accordance with the ACPI specification), etc. In an example, PCU 2410 and/or PMIC 2412 may control a voltage output by VR 2414 and/or a frequency of a clock signal output by the clock generator, e.g., by outputting the VID signal and/or the FID signal, respectively. In an example, PCU 2410 and/or PMIC 2412 may control battery power usage, charging of battery 2418, and features related to power saving operation.

The clock generator 2416 can comprise a phase locked loop (PLL), frequency locked loop (FLL), or any suitable clock source. In some embodiments, each core of processor 2404 has its own clock source. As such, each core can operate at a frequency independent of the frequency of operation of the other core. In some embodiments, PCU 2410 and/or PMIC 2412 performs adaptive or dynamic frequency scaling or adjustment. For example, clock frequency of a processor core can be increased if the core is not operating at its maximum power consumption threshold or limit. In some embodiments, PCU 2410 and/or PMIC 2412 determines the operating condition of each core of a processor, and opportunistically adjusts frequency and/or power supply voltage of that core without the core clocking source (e.g., PLL of that core) losing lock when the PCU 2410 and/or PMIC 2412 determines that the core is operating below a target performance level. For example, if a core is drawing current from a power supply rail less than a total current allocated for that core or processor 2404, then PCU 2410 and/or PMIC 2412 can temporalily increase the power draw for that core or processor 2404 (e.g., by increasing clock frequency and/or power supply voltage level) so that the core or processor 2404 can perform at higher performance level. As such, voltage and/or frequency can be increased temporalily for processor 2404 without violating product reliability.

In an example, PCU 2410 and/or PMIC 2412 may perform power management operations, e.g., based at least in part on receiving measurements from power measurement circuitries 2442, temperature measurement circuitries 2440, charge level of battery 2418, and/or any other appropriate information that may be used for power management. To that end, PMIC 2412 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor(s) may be directly coupled to PCU 2410 and/or PMIC 2412 in at least one embodiment to allow PCU 2410 and/or PMIC 2412 to manage processor core energy at least in part based on value(s) detected by one or more of the sensors.

Also illustrated is an example software stack of device 2400 (although not all elements of the software stack are illustrated). Merely as an example, processors 2404 may execute application programs 2450, Operating System 2452, one or more Power Management (PM) specific application programs (e.g., generically referred to as PM applications 2458), and/or the like. PM applications 2458 may also be executed by the PCU 2410 and/or PMIC 2412. OS 2452 may also include one or more PM applications 2456*a*, 2456*b*, 2456*c*. The OS 2452 may also include various drivers 2454*a*, 2454*b*, 2454*c*, etc., some of which may be specific for power management purposes. In some embodiments, device 2400 may further comprise a Basic Input/Output System (BIOS) 2420. BIOS 2420 may communicate with OS 2452 (e.g., via one or more drivers 2454), communicate with processors 2404, etc.

For example, one or more of PM applications 2458, 2456, drivers 2454, BIOS 2420, etc. may be used to implement power management specific tasks, e.g., to control voltage and/or frequency of various components of device 2400, to control wake-up state, sleep state, and/or any other appropriate power state of various components of device 2400, control battery power usage, charging of the battery 2418, features related to power saving operation, etc.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Various embodiments described herein are illustrated as examples. The features of these examples can be combined with one another in any suitable way. These examples include:

Example 1

An apparatus comprising: a stress controller to adjust voltage for a power supply and voltage for a ground supply in accordance with one or more sensors; and an aging detector circuitry coupled to the stress controller, wherein the aging detector circuitry comprises a ring oscillator having delay stages, wherein each delay stage comprises an aging monitor circuitry, wherein the stress controller is to adjust voltage for a power supply and/or voltage for a ground supply of an individual delay stage of the delay stages.

Example 2

The apparatus of example 1, wherein the stress controller comprises a finite state machine.

Example 3

The apparatus of example 1, wherein the one or more sensors include: temperature sensor and work load monitor.

Example 4

The apparatus of example 3, comprises a dynamic voltage and/or frequency controller coupled to the stress controller, wherein the dynamic voltage and/or frequency controller is to instruct the stress controller to adjust one or more of the power supply and voltage for the ground supply according to an output of a workload monitor, and wherein the workload monitor is to monitor power consumption of one or more logics.

Example 5

The apparatus of example 1, wherein the individual delay stage comprises: a first inverter to receive an input; a second inverter to receive the input; a first multiplexer coupled to an output of the first inverter and the input; and a second multiplexer coupled to an output of second inverter and the input.

Example 6

The apparatus of example 5, wherein the first and second multiplexers are controllable by a same select signal.

Example 7

The apparatus of example 5, wherein the individual delay stage comprises: a p-type device coupled to an output of the first multiplexer; and an n-type device coupled to an output of the second multiplexer, wherein the p-type and n-type devices are coupled in series.

Example 8

The apparatus of example 7, wherein drain terminals of the p-type and n-type devices is an output of the individual delay stage.

Example 9

The apparatus of example 5, wherein the first inverter comprises an n-type device with its source terminal coupled to a ground supply rail that is to receive the ground supply from the stress controller.

Example 10

The apparatus of example 5, wherein the second inverter comprises a p-type device with its source terminal coupled to a power supply rail that is to receive the power supply from the stress controller.

Example 11

The apparatus of example 5, wherein the first and second multiplexers are operable to cause the delay stage to operate in stress mode or measurement mode.

Example 12

The apparatus of example 1, wherein the aging detector circuitry is to detect one of bias temperature instability (BTI) or Hot carrier injection (HCI) one at a time.

Example 13

The apparatus of example 1, wherein the ring oscillator includes a NAND gate coupled to the first and the last delay stage of the delay stages.

Example 14

An apparatus comprising: a controller to set power supply and/or ground supply voltages; a ring oscillator coupled to the controller, wherein the ring oscillator comprises delay stages coupled in a ring formation, wherein an individual delay stage comprises: a first inverter to receive an input, wherein the first inverter comprises an n-type device with its source terminal coupled to a ground supply rail that is to receive the ground supply from the stress controller; a second inverter to receive the input; a first multiplexer coupled to an output of the first inverter and the input; and a second multiplexer coupled to an output of second inverter and the input.

Example 15

The apparatus of example 14, wherein the second inverter comprises a p-type device with its source terminal coupled to a power supply rail that is to receive the power supply from the stress controller.

Example 16

The apparatus of example 14, wherein the first and second multiplexers are controllable by a same select signal.

Example 17

The apparatus of example 14, wherein the individual delay stage comprises: a p-type device coupled to an output of the first multiplexer; and an n-type device coupled to an output of the second multiplexer, wherein the p-type and n-type devices are coupled in series.

Example 18

The apparatus of example 14, wherein the controller to adjust voltage for the power supply and voltage for the ground supply in accordance with one or more sensors.

Example 19

A system comprising: a memory; a processor coupled to the memory, wherein the processor includes: a stress controller to adjust voltage for a power supply and voltage for a ground supply in accordance with one or more sensors; and an aging detector circuitry coupled to the stress controller, wherein the aging detector circuitry comprises a ring oscillator having delay stages, wherein each delay stage comprises an aging monitor circuitry, wherein the stress controller is to adjust voltage for a power supply and/or voltage for a ground supply of an individual delay stage of the delay stages; and a wireless interface to allow the processor to communicate with another device.

Example 20

The system of claim 19, wherein the individual delay stage comprises: a first inverter to receive an input; a second inverter to receive the input; a first multiplexer coupled to an output of the first inverter and the input; a second multiplexer coupled to an output of second inverter and the input, wherein the first and second multiplexers are controllable by a same select signal; a p-type device coupled to an output of the first multiplexer; and an n-type device coupled to an output of the second multiplexer, wherein the p-type and n-type devices are coupled in series; wherein the first inverter comprises an n-type device with its source terminal coupled to a ground supply rail that is to receive the ground supply from the stress controller; and wherein the second inverter comprises a p-type device with its source terminal coupled to a power supply rail that is to receive the power supply from the stress controller.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus comprising:
a stress controller to adjust voltage for a power supply and voltage for a ground supply in accordance with one or more sensors; and
an aging detector circuitry coupled to the stress controller, wherein the aging detector circuitry comprises a ring oscillator having delay stages, wherein each delay stage comprises an aging monitor circuitry, wherein the stress controller is to adjust voltage for a power supply and/or voltage for a ground supply of an individual delay stage of the delay stages.

2. The apparatus of claim 1, wherein the stress controller comprises a finite state machine.

3. The apparatus of claim 1, wherein the one or more sensors include: temperature sensor and work load monitor.

4. The apparatus of claim 3, comprises a dynamic voltage and/or frequency controller coupled to the stress controller, wherein the dynamic voltage and/or frequency controller is to instruct the stress controller to adjust one or more of the power supply and voltage for the ground supply according to an output of a workload monitor, and wherein the workload monitor is to monitor power consumption of one or more logics.

5. The apparatus of claim 1, wherein the individual delay stage comprises:
a first inverter to receive an input;
a second inverter to receive the input;
a first multiplexer coupled to an output of the first inverter and the input; and
a second multiplexer coupled to an output of the second inverter and the input.

6. The apparatus of claim 5, wherein the first and second multiplexers are controllable by a same select signal.

7. The apparatus of claim 5, wherein the individual delay stage comprises:
a p-type device coupled to an output of the first multiplexer; and
an n-type device coupled to an output of the second multiplexer, wherein the p-type and n-type devices are coupled in series.

8. The apparatus of claim 7, wherein drain terminals of the p-type and n-type devices is an output of the individual delay stage.

9. The apparatus of claim 5, wherein the first inverter comprises an n-type device with its source terminal coupled to a ground supply rail that is to receive the ground supply from the stress controller.

10. The apparatus of claim 5, wherein the second inverter comprises a p-type device with its source terminal coupled to a power supply rail that is to receive the power supply from the stress controller.

11. The apparatus of claim 5, wherein the first and second multiplexers are operable to cause the delay stage to operate in stress mode or measurement mode.

12. The apparatus of claim 1, wherein the aging detector circuitry is to detect one of bias temperature instability (BTI) or Hot carrier injection (HCI) one at a time.

13. The apparatus of claim 1, wherein the ring oscillator includes a NAND gate coupled to the first and the last delay stage of the delay stages.

14. An apparatus comprising:
a controller to set power supply and/or ground supply voltages;
a ring oscillator coupled to the controller, wherein the ring oscillator comprises delay stages coupled in a ring formation, wherein an individual delay stage comprises:
a first inverter to receive an input, wherein the first inverter comprises an n-type device with its source terminal coupled to a ground supply rail that is to receive the ground supply from the stress controller;
a second inverter to receive the input;
a first multiplexer coupled to an output of the first inverter and the input; and
a second multiplexer coupled to an output of second inverter and the input.

15. The apparatus of claim 14, wherein the second inverter comprises a p-type device with its source terminal coupled to a power supply rail that is to receive the power supply from the stress controller.

16. The apparatus of claim 14, wherein the first and second multiplexers are controllable by a same select signal.

17. The apparatus of claim 14, wherein the individual delay stage comprises:
a p-type device coupled to an output of the first multiplexer; and
an n-type device coupled to an output of the second multiplexer, wherein the p-type and n-type devices are coupled in series.

18. The apparatus of claim 14, wherein the controller to adjust voltage for the power supply and voltage for the ground supply in accordance with one or more sensors.

19. A system comprising:
a memory;
a processor coupled to the memory, wherein the processor includes:
a stress controller to adjust voltage for a power supply and voltage for a ground supply in accordance with one or more sensors; and
an aging detector circuitry coupled to the stress controller, wherein the aging detector circuitry comprises a ring oscillator having delay stages, wherein each delay stage comprises an aging monitor circuitry, wherein the stress controller is to adjust voltage for a power supply and/or voltage for a ground supply of an individual delay stage of the delay stages; and
a wireless interface to allow the processor to communicate with another device.

20. The system of claim 19, wherein the individual delay stage comprises:
a first inverter to receive an input;
a second inverter to receive the input;
a first multiplexer coupled to an output of the first inverter and the input;
a second multiplexer coupled to an output of second inverter and the input, wherein the first and second multiplexers are controllable by a same select signal;
a p-type device coupled to an output of the first multiplexer; and
an n-type device coupled to an output of the second multiplexer, wherein the p-type and n-type devices are coupled in series;
wherein the first inverter comprises an n-type device with its source terminal coupled to a ground supply rail that is to receive the ground supply from the stress controller; and
wherein the second inverter comprises a p-type device with its source terminal coupled to a power supply rail that is to receive the power supply from the stress controller.

* * * * *